US009122699B2

(12) United States Patent
Molaro et al.

(10) Patent No.: US 9,122,699 B2
(45) Date of Patent: Sep. 1, 2015

(54) FAILURE RESILIENT DISTRIBUTED REPLICATED DATA STORAGE SYSTEM

(71) Applicant: DataDirect Networks, Inc., Chatsworth, CA (US)

(72) Inventors: Donald J. Molaro, Cupertino, CA (US); David Fellinger, Westlake Village, CA (US); Adam Fried-Gintis, Lake Balboa, CA (US); Dan Olster, Woodland Hills, CA (US)

(73) Assignee: DataDirect Networks, Inc., Chatsworth, CA (US)

( * ) Notice: Subject to any disclaimer, the term of this patent is extended or adjusted under 35 U.S.C. 154(b) by 66 days.

(21) Appl. No.: 13/715,519

(22) Filed: Dec. 14, 2012

(65) Prior Publication Data

US 2014/0172930 A1 Jun. 19, 2014

(51) Int. Cl.
*G06F 17/30* (2006.01)
(52) U.S. Cl.
CPC .................. *G06F 17/30215* (2013.01)
(58) Field of Classification Search
CPC ............. G06F 17/30073; G06F 17/30082; G06F 17/30091; G06F 17/30094; G06F 17/30194; G06F 17/30197; G06F 17/30575; G06F 17/30215
USPC .................. 707/640, 652, 821, 827
See application file for complete search history.

(56) References Cited

U.S. PATENT DOCUMENTS

| | | | | |
|---|---|---|---|---|
| 7,529,970 B2* | 5/2009 | Hartline et al. | ............... | 714/6.2 |
| 7,734,643 B1* | 6/2010 | Waterhouse et al. | ......... | 707/770 |
| 8,972,478 B1* | 3/2015 | Storer et al. | ................ | 709/201 |
| 2002/0178162 A1* | 11/2002 | Ulrich et al. | ................ | 707/10 |
| 2009/0106255 A1* | 4/2009 | Lacapra et al. | ............... | 707/10 |
| 2010/0180153 A1* | 7/2010 | Jernigan et al. | ................ | 714/6 |
| 2011/0196900 A1* | 8/2011 | Drobychev et al. | .......... | 707/812 |
| 2013/0226923 A1* | 8/2013 | Thing | .......................... | 707/737 |

OTHER PUBLICATIONS

Rodrigues et al., "High Availability in DHTs: Erasure Coding vs. Replication", Peer-to-Peer Systems IV 4th International Workshop IPTPS 2005 Published Feb. 2005, accessed May 9, 2013, http://pmg.csail.mit.edu/papers/rodrigo_IPTPS05.pdf.
Huang et al., "Erasure Coding in Windows Azure Storage", Microsoft Corporation, 2012 Usenic best paper, accessed May 9, 2013, http://research.microsoft.com/en-us/um/people/yekhanin/Papers/UsenixATC_2012.pdf.

(Continued)

*Primary Examiner* — Hares Jami
(74) *Attorney, Agent, or Firm* — SoCal IP Law Group LLP; Mark A. Goldstein

(57) ABSTRACT

A failure resilient distributed replicated data storage system is described herein. The storage system includes zones that are independent, and autonomous from each other. The zones include nodes that are independent and autonomous. The nodes include storage devices. When a data item is stored, it is partitioned into a plurality of data objects and a plurality of parity objects calculated. Reassembly instructions are created for the data item. The data objects and parity objects are spread across all nodes and zones in the storage system. Reassembly instructions are also spread across the zones. When a read request is received, the data item is prepared from the lowest latency nodes according to the reassembly instructions. This provides for data resiliency while keeping the amount of storage space required relatively low.

24 Claims, 7 Drawing Sheets

(56) References Cited

OTHER PUBLICATIONS

Gsoedl, "Inside object-based storage", SearchStorage.com, article published Jun. 2012, accessed Oct. 5, 2012, http://searchstorage.techtarget.com/magazineContent/Inside-object-based-storage?vgnextfmt=print, pp. 1-3.

Gsoedl, "Advantages of using an object storage system", SearchStorage.com, article published Jul. 30, 2012, accessed Oct. 5, 2012, http://searchcloudstorage.techtarget.com/tip/Advantages-of-using-an-object-storage-system?vgnextfmt=print, pp. 1-3.

Primmer, "Distributed Object Store Principles of Operation: The Case for Intelligent Storage", White Paper, Published Jul. 2010 by Hitachi Data Systems, total of 20 pages.

Terrace et al., "Object Storage on CRAQ, High-throughput chain replication for read-mostly workloads", In Proc. USENIX Annual Technical Conference, San Diego, CA, Jun. 2009, total of 16 pages.

Taylor, "Object-based storage promises scalability and flexibility for static, unstructured data needs", SearchStorage.co.UK, Apr. 11, 2011, total of 2 pages.

Slack, "Object-based storage for cloud storage: Product assessments", searchCloudProvider.com, published Oct. 26, 2010, 2 total pages.

Slack, "Object storage: Object-based storage devices challenge file systems for unstructured data sets", SearchStorageChannel.com, published Sep. 22, 2010, 2 total pages.

Carns et al., "Object storage semantics for replicated concurrent-writer file systems", journal, Argonne National Laboratory, accessed Oct. 5, 2012, http://www.mcs.anl.gov/events/workshops/iasds10/carns_iasds2010.pdf.

Factor et al., "Object Storage: The Future Building Block for Storage Systems", A Position Paper, IBM Haifa Research Laboratories, pp. 101-105, accessed Oct. 5, 2012, https://www.research.ibm.com/haifa/projects/storage/objectstore/papers/PositionOSD.pdf.

Rackspace, Inc., "CloudFiles Introduction", Jan. 24, 2011, 13 total pages.

DataDirect Networks, Inc., "Web Object Scaler", Brochure, Mar. 9, 2010, total of 4 pages.

Connor et al., "Cloud Storage: Adoption, Practice and Deployment", Storage Strategies NOW, Outlook Report, Published Apr. 4, 2011, total of 112 pages.

* cited by examiner

FAILURE RESILIENT DISTRIBUTED REPLICATED DATA STORAGE SYSTEM

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

1. Field

This disclosure relates to data stored in a distributed replicated data storage system and an improved resilient method for storing and accessing data in a distributed replicated data storage system.

2. Description of the Related Art

A file system is used to store and organize computer data stored as electronic files. File systems allow files to be found, read, deleted, and otherwise accessed. File systems store files on one or more storage devices. File systems store files on storage media such as hard disk drives and silicon storage devices.

Various applications may store large numbers of documents, images, audio, videos and other data as objects using a distributed replicated data storage system in which data is replicated and stored in at least two locations.

DETAILED DESCRIPTION

Environment

Figure 1:
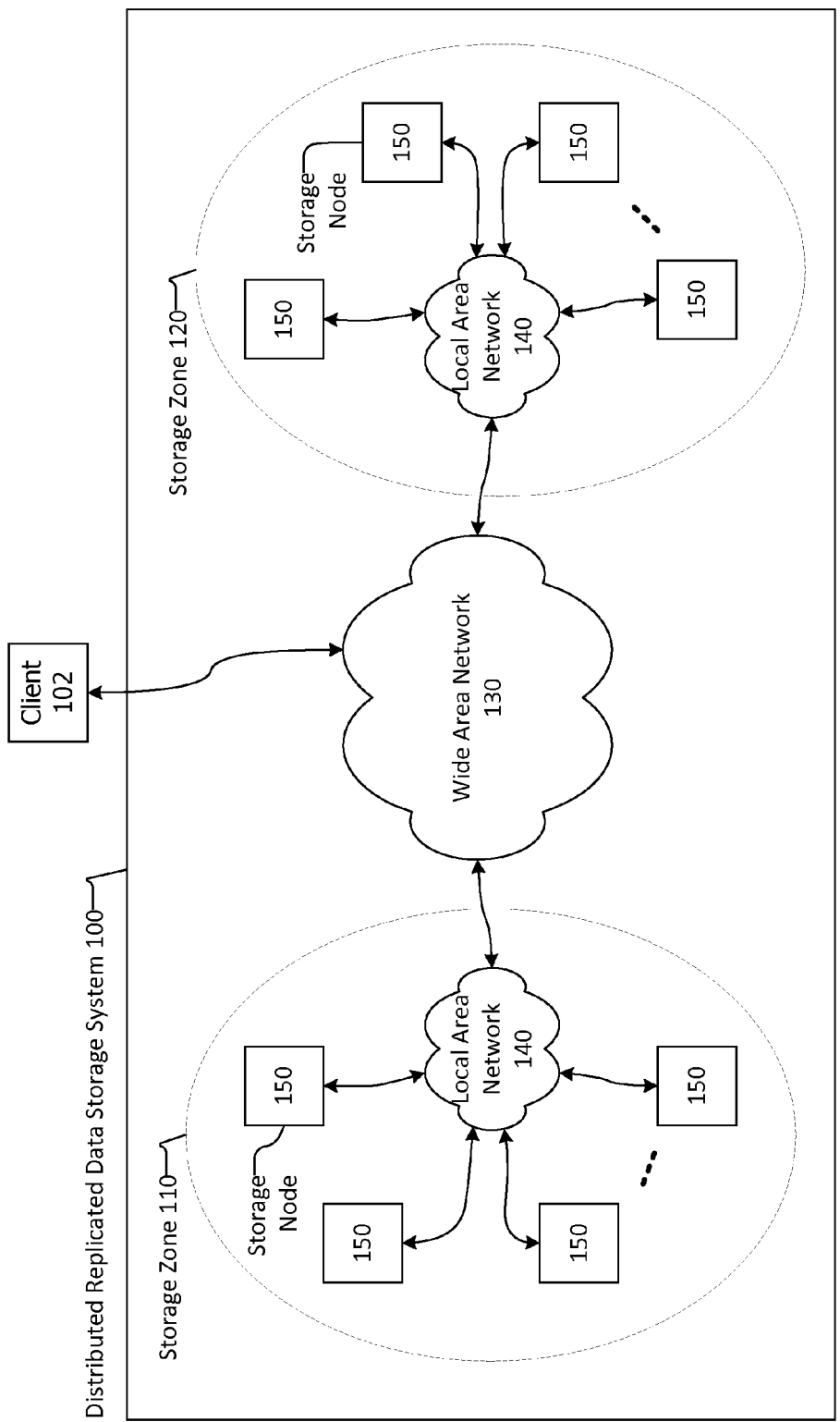
FIG. 1 is a block diagram of a distributed replicated data storage system.

FIG. 1 is a block diagram of a distributed replicated data storage system 100. The distributed replicated data storage system 100 includes at least two storage zones. The distributed replicated data storage system 100 includes multiple storage zones that are independent of one another, may be geographically dispersed and are in a peer-to-peer configuration. In the example shown, the distributed replicated data storage system 100 includes two storage zones, first storage zone 110 and second storage zone 120.

The storage zones 110 and 120 are separated geographically. The storage zones 110 and 120 communicate with each other and share objects over wide area network 130. The wide area network 130 may be or include the Internet. The wide area network 130 may be wired, wireless, or a combination of these. The wide area network 130 may be public or private, may be a segregated network, and may be a combination of these. The wide area network 130 includes networking devices such as routers, hubs, switches and the like.

The term data as used herein includes a bit, byte, word, block, stripe or other unit of information. In one embodiment the data is stored within and by the distributed replicated data storage system as objects. As used herein, the term data is inclusive of entire computer readable files or portions of a computer readable file. The computer readable file may include or represent text, numbers, data, images, photographs, graphics, audio, video, computer programs, computer source code, computer object code, executable computer code, and/or a combination of these and similar information.

Many data intensive applications store a large quantity of data, these applications include scientific applications, newspaper and magazine websites (for example, nytimes.com and life.com), scientific lab data capturing and analysis programs, video and film creation software, and consumer web based applications such as social networking websites (for example, FACEBOOK), photo sharing websites (for example, FLIKR), video sharing websites (for example, YOUTUBE) and music distribution websites (for example, ITUNES).

Figure 2:
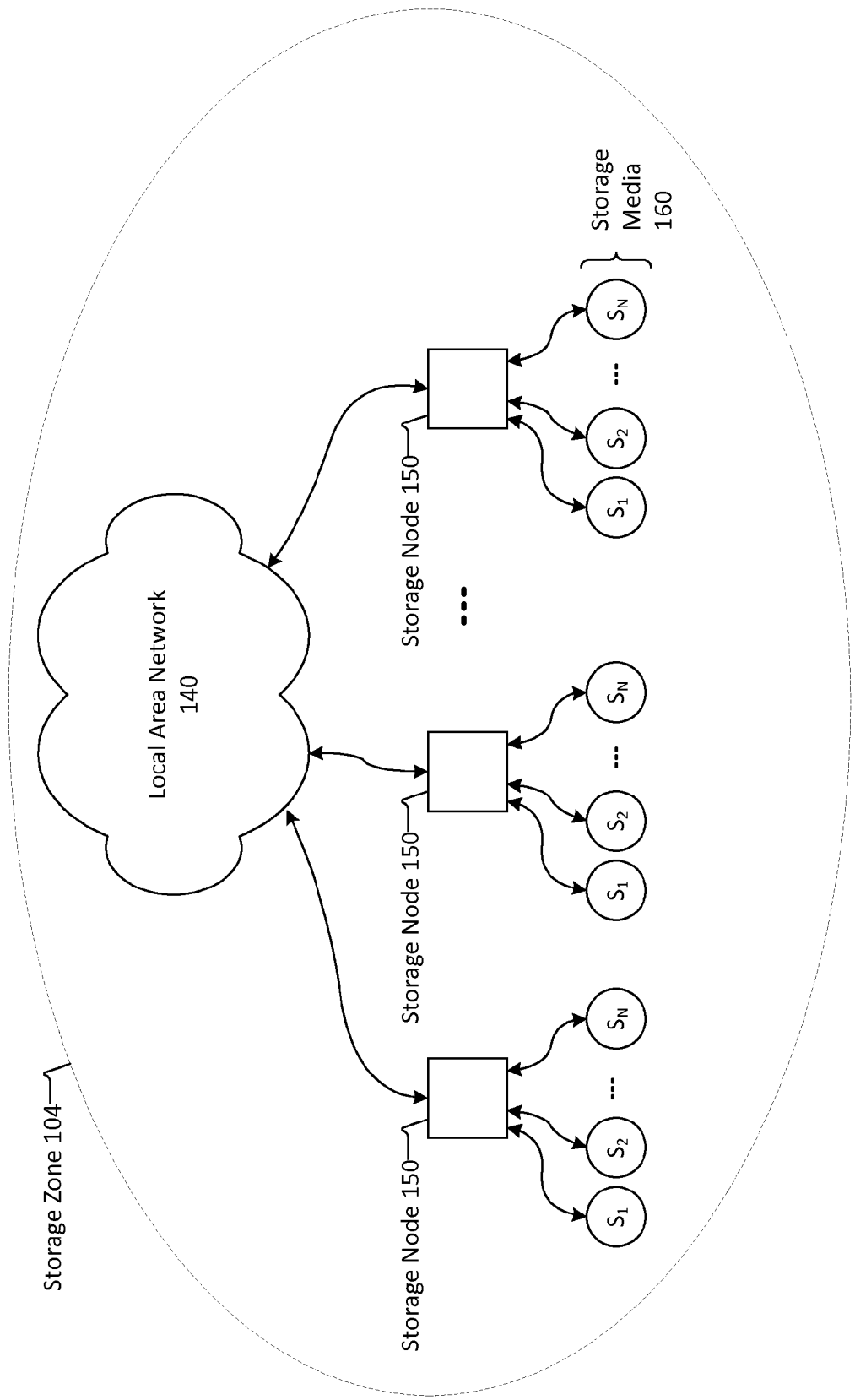
FIG. 2 is a block diagram of a storage zone included in a distributed replicated data storage system.

FIG. 2 is a block diagram of a storage zone 104 included in a distributed replicated data storage system. The storage zones 110 and 120 shown in FIG. 1 are examples of storage zone 104. The storage nodes 150 within a storage zone 104 may be connected via a local area network 140 by wire lines, optical fiber cables, wireless communication connections, and others, and may be a combination of these. The local area network 140 may include one or more networking devices such as routers, hubs, switches and the like.

Referring again to FIG. 1, one node in one of the storage zones may include an object management system and/or application program that automatically identifies and adapts to impairments in the storage nodes 150. That is, software in a node in the storage zone 110 may monitor and recognize multiple kinds of impairments, including, for example, storage node failures; storage device failures; storage nodes with diminished capacity such as one or more down or diminished drives; storage devices with diminished capacity such as bad blocks or sectors; other equipment failures; offline nodes; offline storage devices; missing data; impaired data; and other system anomalies. When the software in a node in the storage zone recognizes an impairment, the distributed replicated data storage system may automatically adapt. In a related embodiment, the distributed replicated data storage system 100 may include an application program that automatically identifies impairments in constituent storage zones and takes remedial action.

The storage zones 110, 120 and 104 may include a computing device and/or a controller on which software may execute. The computing device and/or controller may include one or more of logic arrays, memories, analog circuits, digital circuits, software, firmware, and processors such as microprocessors, field programmable gate arrays (FPGAs), application specific integrated circuits (ASICs), programmable logic device (PLDs) and programmable logic array (PLAs). The hardware and firmware components of the computing device and/or controller may include various specialized units, circuits, software and interfaces for providing the functionality and features described herein. The processes, functionality and features described herein may be embodied in whole or in part in software which operates on a controller and/or one or more computing devices and may be in the form of one or more of firmware, an application program, object code, machine code, an executable file, an applet, a COM object, a dynamic linked library (DLL), a script, one or more subroutines, or an operating system component or service, and other forms of software. The hardware and software and their functions may be distributed such that some actions are performed by a controller or computing device, and others by other controllers or computing devices within a storage zone.

A computing device as used herein refers to any device with a processor, memory and a storage device that may execute instructions such as software including, but not limited to, server computers, personal computers, portable computers, and laptop computers. The computing devices may run an operating system, including, for example, versions of the Linux, Unix, MS-DOS, Microsoft Windows, Solaris, Symbian, Android, Chrome, and Apple Mac OS X operating systems. Computing devices may include a network interface in the form of a card, chip or chip set that allows for communication over a wired and/or wireless network. The network interface may allow for communications according to various protocols and standards, including, for example, versions of Ethernet, INFINIBAND® network, Fibre Channel, and others. A computing device with a network interface is considered network capable.

Referring again to FIG. 2, the storage zone 104 includes a plurality of storage nodes 150 which include a plurality of storage media 160. Each of the storage nodes 150 may include one or more server computers. Each of the storage nodes 150 may be an independent network attached storage (NAS) device or system. The term "storage media" is used herein to refer to any configuration of hard disk drives, solid-states drives, silicon storage devices, magnetic tape, or other similar storage media. Hard disk drives and/or other storage media 160 may also be arranged in the storage nodes 150 according to any of a variety of techniques.

The storage media included in a storage node may be of the same capacity, may have the same physical size, and may conform to the same specification, such as, for example, a hard disk drive specification. Example sizes of storage media include, but are not limited to, 2.5" and 3.5". Example hard disk drive capacities include, but are not limited to, 500 Mbytes, 1 terabyte and 2 terabytes. Example hard disk drive specifications include Serial Attached Small Computer System Interface (SAS), Serial Advanced Technology Attachment (SATA), and others. An example storage node may include 16 one terabyte 3.5" hard disk drives conforming to the SATA standard. In other configurations, the storage nodes 150 may include more and fewer drives, such as, for example, 10, 12, 24 32, 40, 48, 64, etc. In other configurations, the storage media 160 in a storage node 150 may be hard disk drives, silicon storage devices, magnetic tape devices, or a combination of these. In some embodiments, the physical size of the media in a storage node may differ, and/or the hard disk drive or other storage specification of the media in a storage node may not be uniform among all of the storage devices in a storage node 150.

The storage media 160 in a storage node 150 may be included in a single cabinet, rack, shelf or blade. When the storage media in a storage node are included in a single cabinet, rack, shelf or blade, they may be coupled with a backplane. A controller may be included in the cabinet, rack, shelf or blade with the storage devices. The backplane may be coupled with or include the controller. The controller may communicate with and allow for communications with the storage media according to a storage media specification, such as, for example, a hard disk drive specification. The controller may include a processor, volatile memory and non-volatile memory. The controller may be a single computer chip such as an FPGA, ASIC, PLD and PLA. The controller may include or be coupled with a network interface.

In another embodiment, multiple storage nodes 150 are included in a single cabinet or rack such that a storage zone may be included in a single cabinet. When in a single cabinet or rack, storage nodes and/or constituent storage media may be coupled with a backplane. A controller may be included in the cabinet with the storage media and/or storage nodes. The backplane may be coupled with the controller. The controller may communicate with and allow for communications with the storage media. The controller may include a processor, volatile memory and non-volatile memory. The controller may be a single computer chip such as an FPGA, ASIC, PLD and PLA.

The rack, shelf or cabinet containing a storage zone may include a communications interface that allows for connection to other storage zones, a computing device and/or to a network. The rack, shelf or cabinet containing a storage node 150 may include a communications interface that allows for connection to other storage nodes, a computing device and/or to a network. The communications interface may allow for the transmission of and receipt of information according to one or more of a variety of standards, including, but not limited to, universal serial bus (USB), IEEE 1394 (also known as FIREWIRE® and I.LINK®), Fibre Channel, Ethernet, WiFi (also known as IEEE 802.11). The backplane or controller in a rack or cabinet containing a storage zone may include a network interface chip, chipset, card or device that allows for communication over a wired and/or wireless network, including Ethernet. The backplane or controller in a rack or cabinet containing one or more storage nodes 150 may include a network interface chip, chipset, card or device that allows for communication over a wired and/or wireless network, including Ethernet. In various embodiments, the storage zone, the storage node, the controller and/or the backplane may provide for and support 1, 2, 4, 8, 12, 16, etc. network connections and may have an equal number of network interfaces to achieve this.

The techniques discussed herein are described with regard to storage media including, but not limited to, hard disk drives and solid-state drives. The techniques may be implemented with other readable and writable storage media.

As used herein, a storage device is a device that allows for reading from and/or writing to a storage medium. Storage devices include hard disk drives (HDDs), solid-state drives (SSDs), DVD drives, flash memory devices, and others. Storage media include magnetic media such as hard disks and tape, flash memory, and optical disks such as CDs, DVDs and BLU-RAY® discs.

In some embodiments, files and other data may be partitioned into smaller portions and stored as multiple objects among multiple storage media 160 in a storage node 150. Files and other data may be partitioned into smaller portions referred to as objects and stored among multiple storage nodes 150 in a storage zone. In one embodiment each object includes a storage policy identifier and a data portion. The object including its constituent data portion is stored among storage nodes and storage zones according to the storage policy specified by the storage policy identifier included in the object. Various policies may be maintained and distributed or known to the nodes in all zones in the distributed replicated storage system. Policies define the replication and placement of data objects in the data storage system. Example policies include, full distribution, single copy, single copy to a specific zone, copy to all zone but a specified zone, and others. The policies may be stored on and distributed from a client 102 to the distributed replicated storage system 100 to all nodes in the storage system. A character (e.g., A, B, C, etc.) or number (0, 1, 2, etc.) or combination of one or more characters and numbers (A1, AAA, A2, BC3, etc.) or other scheme may be associated with and used to identify each of the policies. The client 102 of the storage system 100 may be a computing device such as, for example, a personal computer, tablet, mobile phone, workstation or server.

Referring again to FIG. 1, the wide area network 130 connects geographically separated storage zones. Each of the storage zones includes a local area network 140. The transfer of data between storage nodes in a storage zone is fast compared to communication over the wide area network 130.

Figure 3:
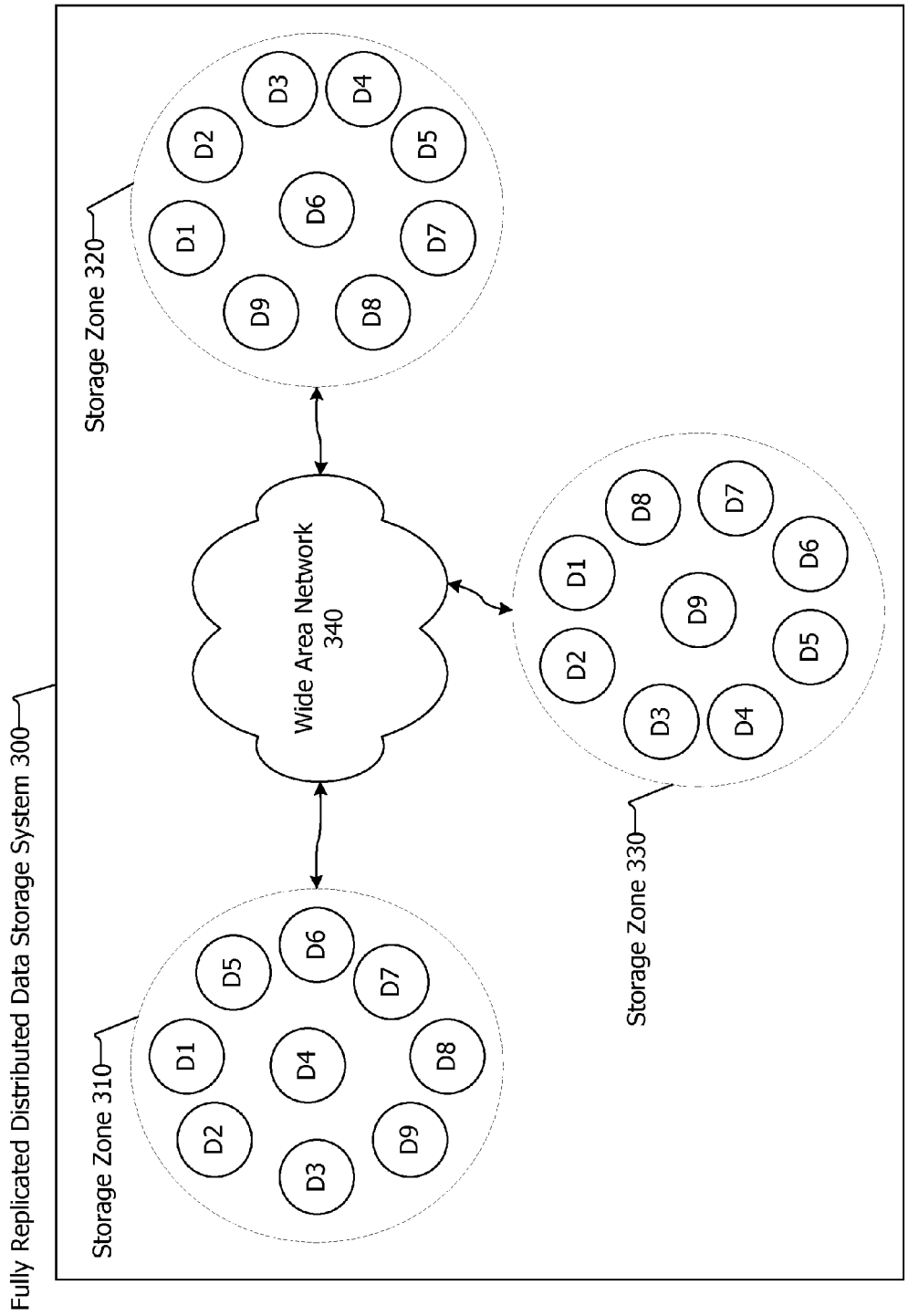
FIG. 3 is a block diagram of an example fully replicated distributed data storage system.

Referring now to FIG. 3, a fully replicated distributed data storage system 300 is shown. In this configuration, all data is replicated among all storage zones such that all copies of stored data are available from and accessible from all storage zones. This is referred to herein as a fully replicated storage system. As shown, a data item is partitioned into data objects D1 through D9. All data objects D1 through D9 are available in all three of storage zones 310, 320 and 330. The data item stored as data objects D1 through D9 may represent one movie, one audio file, or any portion, full or partial, of any data. In a fully replicated storage system, all stored data is accessed from any or all of the storage zones based on various system rules. In a fully replicated configuration, the storage zones 310, 320 and 330 are replicated such that copies of data in all three storage zones are the same. Replication may be performed synchronously, that is, completed before the write operation is acknowledged; asynchronously, that is, the replicas may be written before, after or during the write of the first copy; or a combination of each. Full replication can result in increased storage costs, particularly when there are multiple zones and all data is replicated at all zones. Although this configuration provides for resiliency, it may be costly monetarily and may be too costly monetarily for some. That is, the monetary cost of the constituent storage media required for full replication may be too high.

In the resilient distributed replicated data storage system described herein, when writing data to a storage zone, the data may be replicated in one or more additional storage zones to provide for redundancy such that access to data is possible when a zone goes down or is impaired or unreachable, without the need for full replication. The resilient replication system does not require that each zone have a full copy of all data objects. The techniques described herein result in a lower cost resilient data storage system.

The lower cost is achieved through the use of smaller capacity storage zones (and fewer or smaller capacity storage devices in those storage zones). Because of the monetary cost of data storage devices, the resilient replication system described herein reduces the amount of data stored, requiring a smaller storage capacity which reduces storage media costs.

Figure 4:
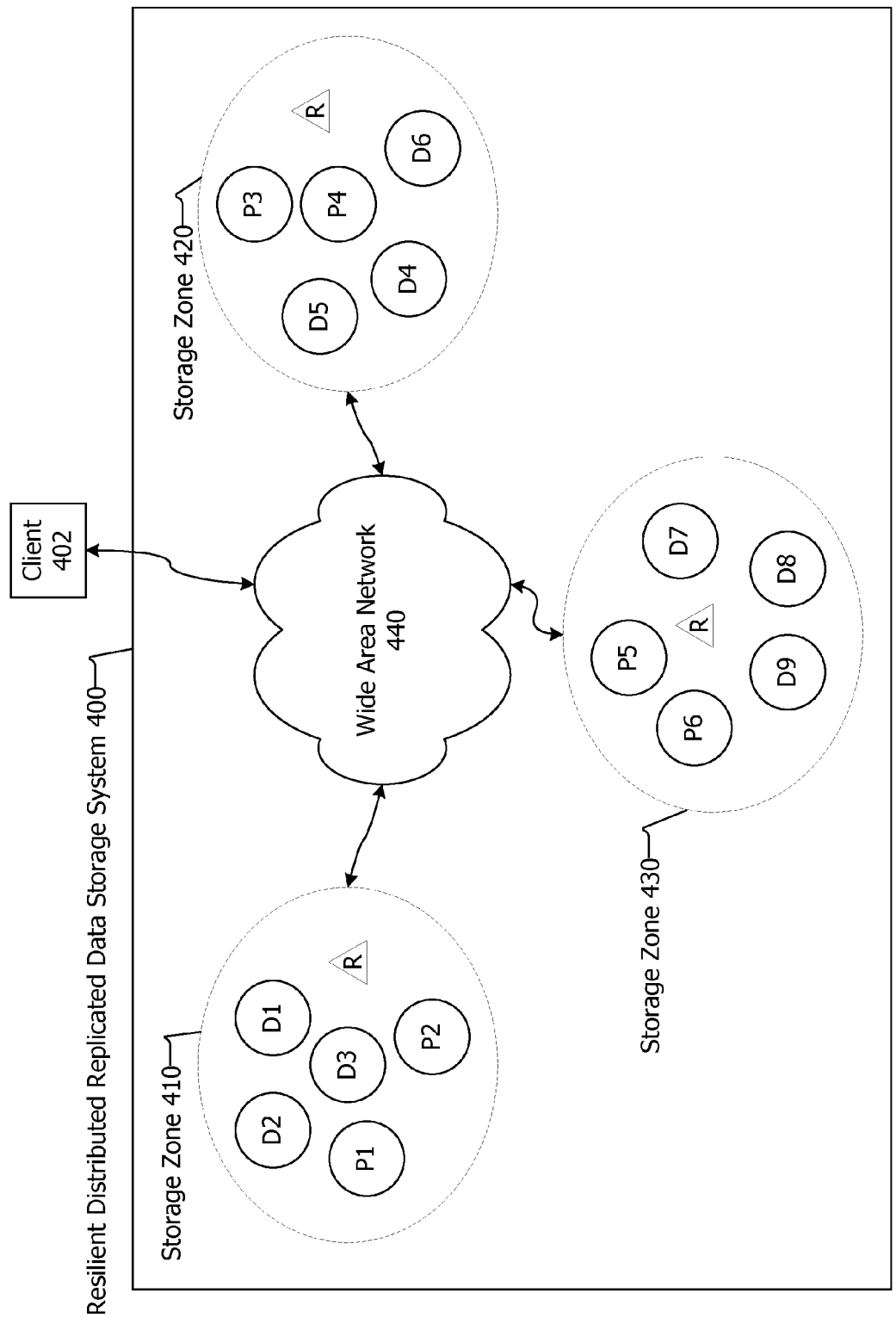
FIG. 4 is a block diagram of a first example resilient distributed replicated data storage system.

Referring now to FIG. 4, a resilient distributed replicated storage system 400 is shown. The resilient distributed replicated data storage system 400 includes multiple storage zones that are independent of one another, are geographically dispersed and are in a peer-to-peer configuration. A client computing device 402 may be used to specify the configuration of the distributed replicated storage system 400 and may promulgate policies or storage criteria for the nodes in the system 400. In this example, a data item is partitioned into nine pieces, data objects D1 through D9. Data objects D1, D2 and D3 are stored in storage zone 410, data objects D4, D5 and D6 are stored in storage zone 420, and data objects D7, D8 and D9 are stored in storage zone 430. Should one of the storage nodes in one of the storage zones become impaired, become unavailable, become inaccessible or go down, the system may recreate the data by using available data objects along with parity objects. When the data objects for the data item are distributed among the three zones, the system creates six parity objects P1 through P6. The system also creates reassembly instructions. The reassembly instructions, shown as R in a triangle in FIG. 4, provide information about how to recreate, reassemble or reconstitute the data item from (in this example, any nine of) the constituent data objects and parity objects. The reassembly instructions include which combinations of objects are needed to reassemble the data item. The reassembly instructions take up very little storage space. The same reassembly instructions are included in each zone. In this example, there are nine data objects and six parity objects. To recreate the data, a combination of any nine objects is needed. That is, for example, to recreate the data item, six data objects and three parity objects may be used. This would be the situation if one of the three storage zones shown in FIG. 4 cannot be used or accessed to recreate the data item. That is, for example, if zone 420 is down or inaccessible, the data objects D1, D2, D3, D6, D7, D8 and parity objects P1, P2, P5 from zones 410 and 430 may be used to recreate the data item.

The creation of parity objects may be based upon a number of well-known erasure coding techniques. In one embodiment, the parity objects are created with the Reed-Solomon technique. See James S. Plank "Erasure Codes for Storage Applications," Tutorial, FAST-2005: 4th Usenix Conference on File and Storage Technologies San Francisco, Calif., December, 2005 and James S. Plank, "A Tutorial on Reed-Solomon Coding for Fault-Tolerance in RAID-like Systems," Software—Practice & Experience, 27(9), September, 1997, pp. 995-1012.

The property of interest for such erasure coding techniques is the ability to repair the loss of data objects with an equal number of parity objects using the technique. For example, the calculation of parity can be used as a simple erasure code. Consider the 8 bit string "10011100", with the addition of the parity bit of "1" (even parity). If the system presents the string "1001X100" with the parity bit of "1" and the parity coding is known to be even, the receiver can infer that the missing bit "X" is a "1". This technique can be generalized to correct as many errors in the stored data as there are parity. The system and methods described herein are dependent on this general property of parity erasure codes and not a specific algorithm or implementation.

Referring to the examples shown in FIGS. 3 and 4, as the data item was partitioned into nine objects, in the fully replicated storage system 300 of FIG. 3, the amount of storage space required for a three zone system would be three times the size of the data. According to the resilient distributed replicated storage system described herein, a zone would have enough storage space for five objects and a small amount of storage space for reassembly instructions. The example resilient distributed replicated storage system 400 of FIG. 4 requires less than two-thirds of the capacity of the fully replicated storage system 300 of FIG. 5 while providing for resiliency and access to data. The one-third reduction in storage needed may result in significant monetary cost savings while providing the user a desired level of resiliency and accessibility.

The software running on a controller or computing device in storage zone 410 may monitor the health of the other storage zones 420 and 430 and/or the storage media in the storage zones 420 and 430. When an impending or actual problem or failure is detected in the storage zones 420 or 430, the storage zone 410 may identify this situation as an access alert. After identifying an access alert, the system uses data objects and parity objects to recreate the data according to the reassembly instructions. The access alert may be identified by a node, and the node may use the reassembly instructions to reassemble the data item by sending requests for data objects and parity objects to other nodes in other zones, if necessary.

In this way a customer of the resilient distributed replicated data storage system may receive the reliability or service level desired or required from a fully replicated storage system at a much lower cost.

The example shown in and described regarding FIG. 4 involves three storage zones and a single data item partitioned into nine objects. The techniques described herein apply to storage systems with multiple storage zones, regardless of the number of storage zones. The techniques described herein apply to any sized data item. The techniques described herein apply to systems with multiple data items. The techniques described herein require that the total number of data objects and parity objects can be divided evenly among the zones in the particular configuration of the resilient distributed replicated data storage system. The techniques described herein optionally allow for multiple copies of data objects and parity objects to be stored to meet the divided equally requirement among storage zones as well as to increase the resiliency of the stored object.

Description of Processes

The method used in the intelligent distributed replicated data storage system may be described as taking a data item, partitioning it into pieces known as data objects and calculating parity information known as parity objects along with reassembly instructions. The system allows for the spreading of data objects and parity objects among multiple storage zones to meet the availability and durability requirements of a particular application or customer. The spreading of the objects among zones is performed so that the durability of the data item is ensured. The number of data objects and parity objects is chosen to map onto the number of zones provided and the required durability. The system may duplicate parity and data objects to increase the resiliency of the stored item according to the policy requirements.

Figure 5:
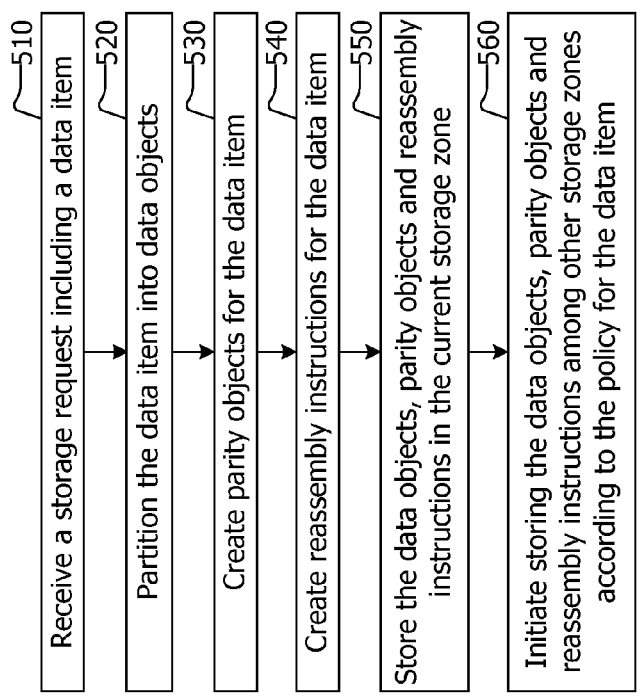
FIG. 5 is a flow chart of the actions taken to store or put data in a resilient distributed replicated data storage system.

Referring now to FIG. 5, a flow chart of the actions taken to store or put data in a resilient distributed replicated data storage system is shown. To store or put a data item, the system receives a storage request that includes a data item (or reference or link to a data item) and may include storage criteria, as shown in block 510. The storage criteria may, in different embodiments specify the storage policy for the data item by a code or name, or may include specific distribution instructions for the data item. The specific distribution instruction may include the exact number of data objects and parity objects the data item for the data item. In one implementation, the system predetermines the number of pieces the item data should be partitioned into according to information provided by the user of the system, and all data items are partitioned the same way. The number of pieces may be determined in part based on the storage criteria specified. The number of pieces is dependent on multiple factors, including the number of zones in the storage system, the specified or desired durability/resiliency of the system, and the desired speed of access to the data item. To increase the resiliency of the storage system, multiple copies of the data objects or parity objects may be dispersed among the storage zones. The number of parity objects may be determined in part based on the storage criteria specified. The number of parity objects is determined based on the number of pieces and the erasure coding technique used. The system may provide a user interface that allows the user to specify information for these factors by allowing for explicit entry of numbers (in text or numerical entry fields, radio button with associated text guides, and/or pull down menus), selection of factors by radio button, slider or other user interface item (such as, for example, a sliding scale for each of access speed, resiliency/durability). The number of pieces evaluation may be performed once during a system install, and may later be recalculated upon a system reconfiguration, such as adding or removing a zone, or changing of a desired access speed or resiliency. In another implementation, the number of pieces a data item is to partitioned into may be hard coded or system defined.

The system then partitions the data item into data objects corresponding to the number of pieces, as shown in block 520. The system also creates parity objects for the data item, as shown in block 530. The partitioning into data objects and creating parity objects is achieved according to erasure coding techniques by one or more nodes in a zone in the distributed replicated data storage system.

According to erasure coding, the data item is divided into n pieces and recoded into n+p total objects, namely n data objects and p parity objects, such that there will be t total objects. According to erasure coding, $t>n>p$. The key property of erasure coding is that the original item can be reconstructed from any n objects from the combination of data objects and parity objects, where the combined size for the n objects is equal or greater than the original data item size. For example, referring to FIG. 4, when the data item is partitioned into nine data objects n and four parity objects p, the total number of objects t is 10 and the number of objects needed to recreate the original data item is n or nine. The erasure coding used may be according to the Reed-Solomon techniques or other suitable techniques.

The system then creates reassembly instructions for the data item, as shown in block 540. The reassembly instructions include information about the data objects and the parity objects including their object identifiers that encode the location of the object.

The system then stores the data objects, parity objects and reassembly instructions in the current storage zone, as shown in block 550. The system stores the data objects, parity objects and reassembly instructions among the other storage zones according to the policy for the data item, as shown in block 560. In one embodiment the system performs the actions in blocks 550 and 560 concurrently when synchronized replication is required. The system performs the actions in blocks 550 and 560 sequentially when asynchronous replication is sufficient. The system stores the data objects, parity objects and reassembly instructions among the storage zones so that when one zone goes down, the system can still provide the data item when requested. In one implementation, the data objects are spread evenly among the storage zones, and there is at least one parity object per storage zone. A copy of the reassembly instructions is stored in every storage zone; the reassembly instructions are the same in each storage zone.

Figure 6:
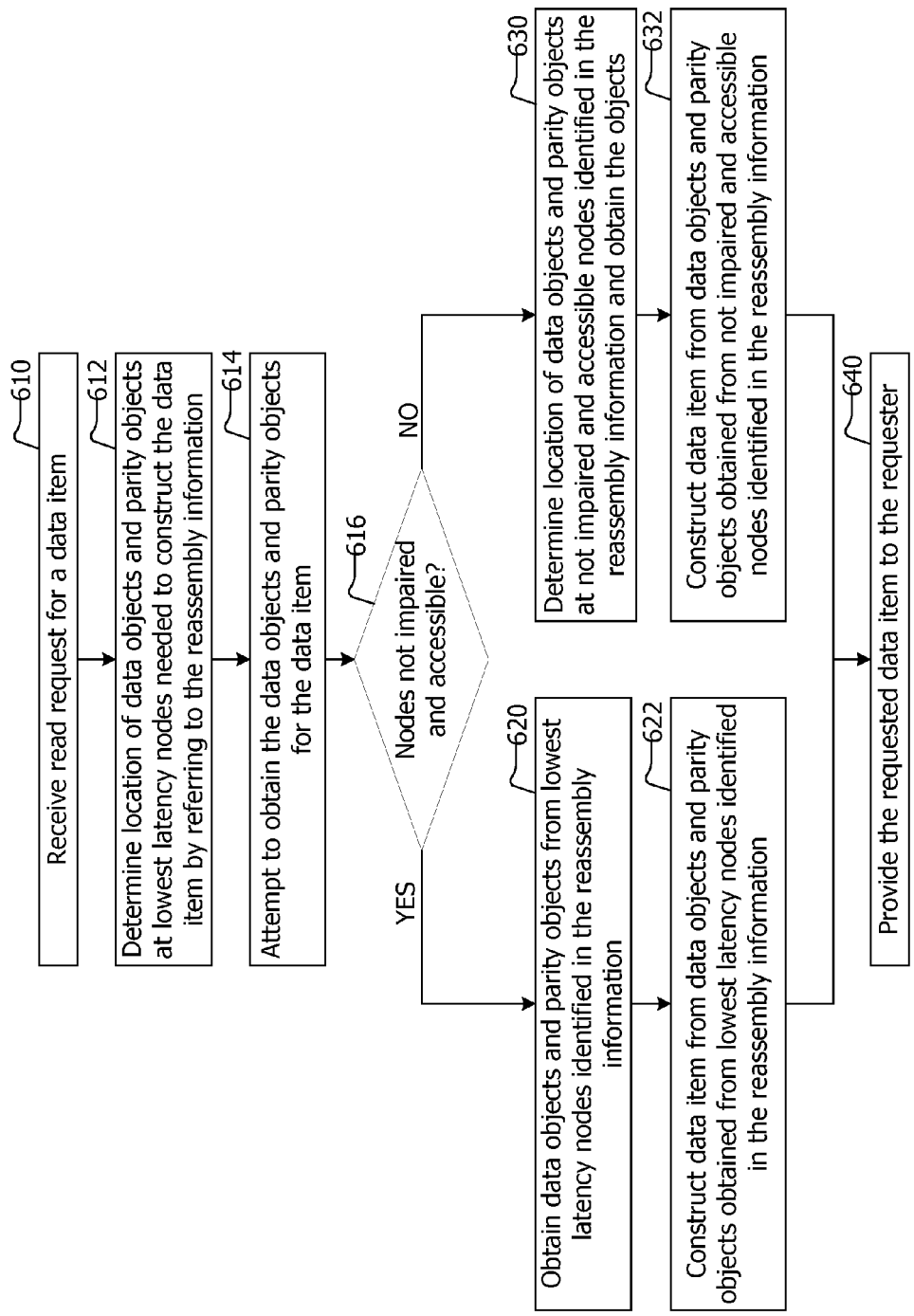
FIG. 6 is a flow chart of the actions taken to read or get data included in a resilient distributed replicated data storage system.

Referring now to FIG. 6, a flow chart of the actions taken to read or get data included in a resilient distributed replicated data storage system is shown. The system receives a read request for a data item, as shown in block 610. The system determines the location of data objects and party objects at lowest latency nodes needed to construct the data item by referring to the reassembly information, as shown in block 612. That is, the system retrieves and reviews the reassembly information to locate sufficient objects to reconstruct the requested data item by referring to a latency map. The system attempts to reconstruct the data item as quickly as possible.

Each node as it operates tracks the time it takes for operations with other nodes. This information about timing concerning operations with other nodes is stored in a list of nodes that includes the historical time to reach other nodes or perform operations involving other nodes. This list of nodes and times may be referred to as a latency map or map of latencies.

When attempting to reconstruct the data item as quickly as possible, the system may refer to the map of latencies to other nodes in the system. The object identifier includes the nodes where each object may be located. The system uses these two pieces of information, the node and the latency to the node, to attempt to retrieve sufficient objects to reconstruct the item in the shortest time. The system then attempts to obtain the data objects and parity objects for the data item, as shown in block 614.

If one or more lowest latency nodes at which data objects or parity objects are stored are either impaired or inaccessible as shown in block 616, the system determines the location of data objects and parity objects at not impaired and accessible nodes needed to construct the data item by referring to the reassembly information and obtains the objects, as shown in block 630. These may be referred to as alternate nodes, that is, the nodes that are not lowest latency but that are not impaired and are available. The system constructs the data item from data objects and parity objects obtained from not impaired and accessible nodes identified in the reassembly information, as shown in block 632, that is, the alternate nodes. The system then constructs the data item from data objects and parity objects obtained from nodes identified in the reassembly information, as shown in block 632. The system provides the requested data item to the requester, as shown in block 650.

When the system attempts to obtain the data objects and parity objects for the data item and all the nodes at which the data objects are stored are not impaired and accessible, the system obtains the data objects from lowest latency nodes identified in the reassembly information, as shown in block 620. The system then constructs the data item from data objects and parity objects obtained from nodes identified in the reassembly information, as shown in block 622. The system provides the requested data item to the requester, as shown in block 640.

The methods described above and shown in FIGS. 5 and 6 may be performed by and managed by a node included in a zone in a distributed replicated data storage system in which the independent nodes communicate with each other. In another embodiment, the methods described above and shown in FIGS. 5 and 6 may be performed by and managed by an independent computing device or controller in a storage zone in a resilient distributed replicated data storage system.

To make the system described herein more resilient and more responsive, a local parity object (or objects) may be created at each zone to assist in recreating any one object in the zone that may not be accessible. For example, if the data objects and parity objects from a zone are needed and one of the parity objects or data objects is on a node or drive that is down, the inaccessible object can be created locally using a locally stored parity object (or objects). This configuration adds another layer of resiliency and reliability to the system.

Figure 7:
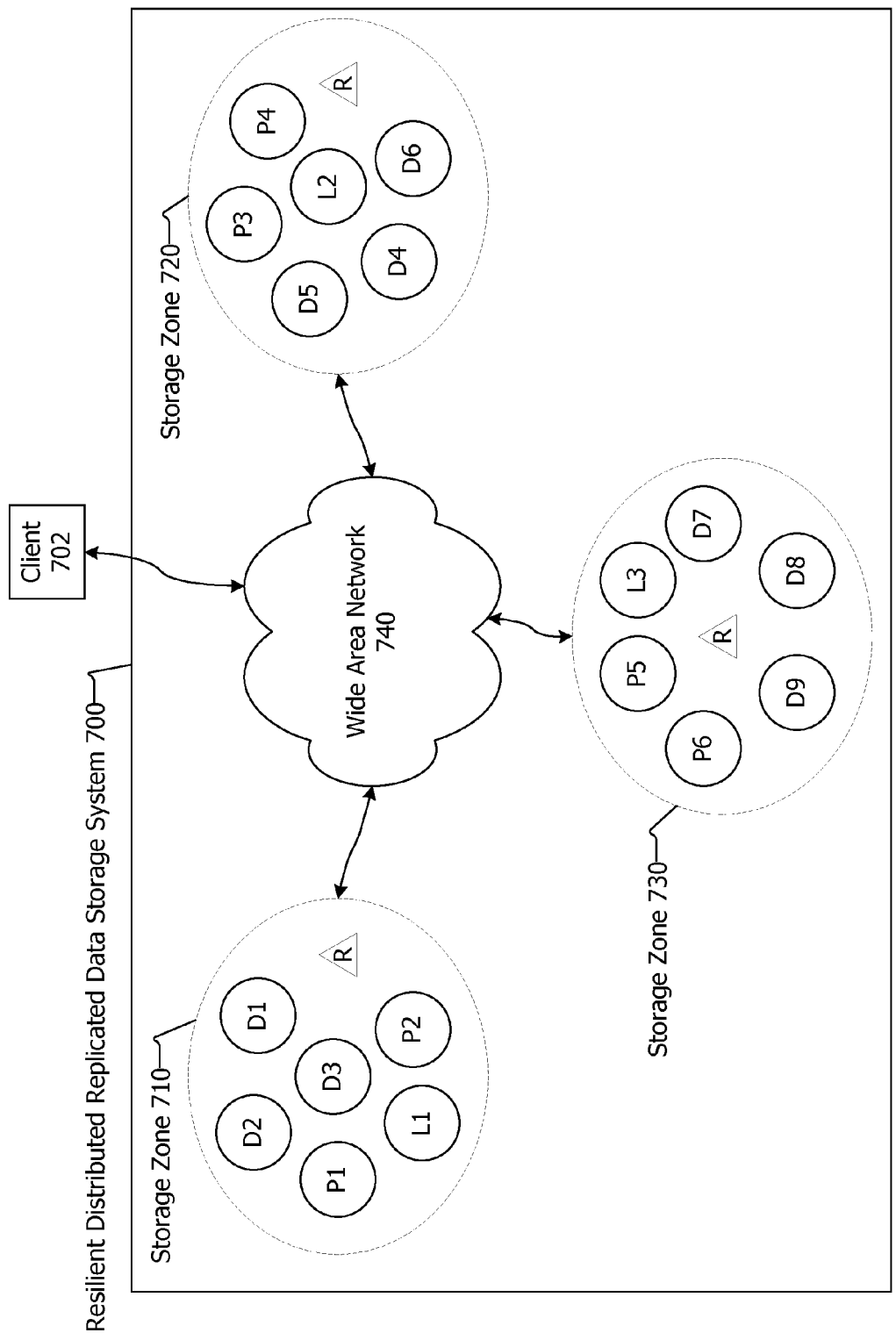
FIG. 7 is a block diagram of a second example resilient distributed replicated data storage system.

Referring now to FIG. 7, a block diagram of a second example resilient distributed replicated data storage system 700 is shown. In the resilient distributed replicated data storage system 700, a local parity object is created and stored in each zone so that if an object stored in that zone is not accessible, it may be recreated locally. The use of local parity objects (L1, L2 and L3 as shown) increases the resiliency and data throughput of the system by alleviating the need to access objects from other zones to recreate an inaccessible object. In this example, a data item is partitioned into nine pieces, data objects D1 through D9. Data objects D1, D2 and D3 are stored in storage zone 710, data objects D4, D5 and D6 are stored in storage zone 720, and data objects D7, D8 and D9 are stored in storage zone 730. Should one of the storage zones or a node within a zone become impaired, become unavailable, become inaccessible or go down, the system may recreate the data by using available data objects along with parity objects. When the data objects for the data item are distributed among the three zones, the system creates six parity objects P1 through P6. In this extra resilient configuration, the system also creates a local parity object for each zone. The local parity objects are created using Reed-Solomon erasure coding or any suitable erasure coding scheme. As shown, the system creates local parity object L1 for zone 710 based on the data objects D1, D2, D3 and parity objects P1, P2 included in the zone. As shown, the system creates local parity object L2 for zone 720 based on the data objects D4, D5, D6 and parity objects P3, P4 included in the zone. As shown, the system creates local parity object L3 for zone 730 based on the data objects D7, D8, D9 and parity objects P5, 62 included in the zone.

The system also creates reassembly instructions. The reassembly instructions, shown as R in a triangle in FIG. 7, provide information about how to recreate, reassemble or reconstitute the data item from (in this example, any nine of) the constituent data objects and parity objects. In this configuration, the reassembly instructions also include information needed to recreate an object inaccessible within a storage zone using a local parity object. The reassembly instructions take up very little space and are small in size. In one embodiment, the same reassembly instructions are included in each zone, and a separate local reassembly instruction object is also provided. In another embodiment, the system reassembly instructions are augmented with local reassembly instructions such that the reassembly instruction object is different for each zone.

When local parity objects are used, the flow of actions to store a data item shown in FIG. 5 is augmented by adding creating a local parity object or local parity objects between blocks 540 and 550. In addition, the creating reassembly instructions for the data item in block 550 may include creating assembly instructions for objects in each of the zones based on the local parity object or objects.

When local parity objects are used, the flow of actions to read or get a data item shown in FIG. 6 is augmented by adding identifying an inaccessible or corrupted drive or object in a node in the zone, and locally recreating the inaccessible object using the local parity object (or objects) according to local zone reassembly instructions. These actions may be taken between blocks 614 and 616, such that the node determines all nodes are not impaired. In this way, a local reconstituted version of the object is obtained from the local zone without having to seek the object from a node in a different zone. This results in increased throughput and efficiency of the system and adds a level of resiliency to the system.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims.

Use of ordinal terms such as "first", "second", "third", etc., "primary", "secondary", "tertiary", etc. in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

It is claimed:

1. A system comprising:
   a plurality of storage zones, each storage zone comprising a plurality of nodes wherein each node comprises a plurality of storage devices and a controller, the controller including a processor and memory
   a first node of a plurality of nodes included in a first zone of the plurality of zones, the first node having instructions which when executed cause a first processor included in a first controller in the first node to perform actions including:
      receiving a storage request from a client of the system to store a data item
      partitioning the data item into a plurality of data objects, each data object including a storage policy identifier and a data portion
      creating a plurality of parity objects for the data item
      creating reassembly instructions for the data item
      storing groups of at least three of the data objects and groups of at least two of the parity objects and the reassembly instructions among the nodes included in the storage zones according to a predetermined set of criteria
      creating at least one local parity object for a first zone based on the received group of parity objects and the received group of data objects
      wherein creating reassembly instructions for the data item includes creating local reassembly instructions, the local reassembly instructions including reference to the local parity object
      wherein each of the data objects are included in at least one of the groups of data objects, but each data object is included in less than all the groups of data objects
      wherein each of the parity objects are included in at least one of the groups of parity objects, but each parity object is included in less than all the groups of parity objects
      wherein some of the parity objects are duplicated among the storage zones
      wherein the predefined set of criteria ensures that the data item can be reconstructed by accessing a subset of the plurality of data objects and the plurality of the parity objects.

2. The system of claim 1 wherein the storage devices are selected from the group including hard disk drives and solid state storage devices.

3. The system of claim 1 wherein the partitioning the data item partitions the data item into data objects wherein some of the data objects are duplicated among the storage zones.

4. The system of claim 1 wherein the partitioning the data item partitions the data item into data objects that are equally distributed among the storage zones.

5. The system of claim 1 wherein the partitioning the data item partitions the data item into data objects that are unequally distributed among the storage zones.

6. The system of claim 1 wherein the creating the parity objects creates parity objects that are equally distributed among the storage zones.

7. The system of claim 1 wherein the creating the parity objects creates parity objects that are unequally distributed among the storage zones.

8. The system of claim 1 wherein the partitioning the data item into a plurality of data objects and the creating a plurality of parity objects are achieved using a parity generating erasure coding scheme.

9. The system of claim 8 wherein the parity generating erasure coding scheme is Reed-Solomon encoding.

10. The system of claim 1 wherein the creating a local parity object is achieved using a parity generating erasure coding scheme.

11. The system of claim 10 wherein the parity generating erasure coding scheme is Reed-Solomon encoding.

12. The system of claim 1 wherein the first node has further instructions which when executed cause the first processor to perform further actions including:
    receiving a read request for the data item
    attempting to obtain data objects and parity objects to reconstruct the data item from lowest latency nodes
    when the lowest latency nodes are not impaired and accessible, constructing the data item from the data objects and parity objects at the lowest latency nodes according to the reassembly instructions
    when one of the lowest latency nodes is either impaired or not accessible, constructing the data item from the data objects and parity objects obtained from alternative nodes according to the reassembly instructions
    using the local parity object to allow for recreation of an inaccessible or corrupted one of the parity objects in the group of parity objects or one of the data objects in the group of data objects
    providing the requested data item to a requester.

13. The system of claim 12 wherein when one of the lowest latency nodes is either impaired or not accessible, reconstituting the node that is either impaired or not accessible using the local parity object according to the local reassembly instructions included in the reassembly instructions.

14. A system comprising:
    a plurality of storage zones, each storage zone comprising a plurality of storage nodes wherein each storage node comprises a plurality of storage devices and a controller, the controller including a processor and memory
    a first node of a plurality of nodes included in a first zone of the plurality of zones, the first node having instructions which when executed cause a first processor included in a first controller in the first node to perform actions including:

receiving a storage request from a client of the system to store a data item, the storage request include (a) the data item or a data item reference and (b) a storage criteria partitioning the data item into a plurality of data objects, each data object including a storage policy identifier and a data portion according to the storage criteria creating a plurality of parity objects for the data item according to the storage criteria creating reassembly instructions for the data item according to the storage criteria storing the data objects and the parity objects among the nodes among the storage zones according to the storage criteria storing the reassembly instructions among the storage nodes among the storage zones creating at least one local parity object for a first zone based on the parity objects and the data objects stored in the first zone wherein creating reassembly instructions for the data item includes creating local reassembly instructions, the local reassembly instructions including reference to the local parity object wherein each of the data objects are included in at least one of the plurality of storage zones, but each data object is included in less than all the plurality of storage zones wherein each of the parity objects are included in at least one of the plurality of storage zones but each parity object is included in less than all the plurality of storage zones wherein some of the parity objects are duplicated among the storage zones wherein the reassembly instructions specify how the data item can be reconstructed from a subset of the plurality of data objects and the plurality of parity objects.

15. The system of claim 14 wherein the storage devices are selected from the group including hard disk drives and solid state storage devices.

16. The system of claim 14 wherein the storage criteria specify whether the data objects should be equally distributed among the storage zones, unequally divided among the storage zones, and duplicated among the storage zones.

17. The system of claim 14 wherein the storage criteria specify whether the parity objects should be equally distributed among the storage zones, unequally divided among the storage zones, and duplicated among the storage zones.

18. The system of claim 14 wherein the storage criteria specify redundancy, latency, and/or resiliency characteristics.

19. The system of claim 14 wherein the storage criteria include designated placement for the data objects and the parity objects among the storage zones.

20. The system of claim 14 wherein the storage criteria are designations of redundancy, latency, and/or resiliency characteristics that are processed to determine the distribution of the data objects and the parity objects among the storage zones.

21. The system of claim 14 wherein the creating a local parity object is achieved using a parity generating erasure coding scheme.

22. The system of claim 21 wherein the parity generating erasure coding scheme is Reed-Solomon encoding.

23. The system of claim 14 wherein the first node has further instructions which when executed cause the first processor to perform further actions including:

receiving a read request for the data item attempting to obtain data objects and parity objects to reconstruct the data item from lowest latency nodes when the lowest latency nodes are not impaired and accessible, constructing the data item from the data objects and parity objects at the lowest latency nodes according to the reassembly instructions when one of the lowest latency nodes is either impaired or not accessible, constructing the data item from the data objects and parity objects obtained from alternative nodes according to the reassembly instructions using the local parity object to allow for recreation of an inaccessible or corrupted one of the parity objects in the parity objects or one of the data objects providing the requested data item to a requester.

24. The system of claim 23 wherein when one of the lowest latency nodes is either impaired or not accessible, reconstituting the node that is either impaired or not accessible using the local parity object according to the local reassembly instructions included in the reassembly instructions.

* * * * *